United States Patent [19]
Matlock et al.

[11] Patent Number: 4,814,285
[45] Date of Patent: Mar. 21, 1989

[54] METHOD FOR FORMING PLANARIZED INTERCONNECT LEVEL USING SELECTIVE DEPOSITION AND ION IMPLANTATION

[75] Inventors: Dyer A. Matlock, Melbourne; Richard L. Lichtel, Jr., Palm Bay, both of Fla.

[73] Assignee: Harris Corp., Melbourne, Fla.

[21] Appl. No.: 19,697

[22] Filed: Feb. 27, 1987

Related U.S. Application Data

[62] Division of Ser. No. 778,691, Sep. 23, 1985, abandoned.

[51] Int. Cl.$^4$ ........................................ H01L 21/283
[52] U.S. Cl. ........................................ 437/24; 437/50; 437/193; 437/194; 437/195
[58] Field of Search ........... 148/DIG. 116, DIG. 117; 357/71; 437/193, 194, 195, 189, 24, 50

[56] References Cited

U.S. PATENT DOCUMENTS

| | | | |
|---|---|---|---|
| 3,864,217 | 2/1975 | Takahata et al. | 437/193 |
| 3,967,371 | 7/1976 | Croset et al. | 437/194 X |
| 4,055,885 | 11/1977 | Takemoto | 437/194 |
| 4,084,986 | 4/1978 | Aoki et al. | 148/1.5 |
| 4,105,805 | 8/1978 | Glendinning et al. | 427/38 |
| 4,123,300 | 10/1978 | Joshi et al. | 437/193 |
| 4,127,931 | 12/1978 | Shiba | 437/193 |
| 4,158,613 | 6/1979 | Sogo | 437/194 X |
| 4,406,051 | 9/1983 | Iizuka | 357/51 X |
| 4,433,004 | 2/1984 | Yonezawa et al. | 427/38 |
| 4,582,563 | 4/1986 | Hazuki et al. | 156/643 |

Primary Examiner—Olik Chaudhuri
Attorney, Agent, or Firm—Antonelli, Terry & Wands

[57] ABSTRACT

On the surface of a semiconductor structure containing portions to be selectively connected to an interconnection pattern, a thin conductive, uniform base layer, which promotes the growth of an interconnect conductor, is desposited. To define the interconnect structure, a thick layer of insulation material is selectively formed on the surface of the base layer with openings in the insulation layer exposing portions of the base layer that are to be connected to the interconnect layer. Next, on the portions of the base layer that are exposed by the openings in the insulation layer, a layer of interconnect metal, such as tungsten or gold, that effectively blocks the implantation of the ions through it, is selectively deposited to fill the openings in the insulation layer upon and even with the top surface of the insulation layer, so that the insulation layer and deposited metal are effectively planarized. The base layer which underlies the planarized insulator/interconnect metal layer is selectively converted to an insulator in those regions beneath the insulator but not beneath the interconnect metal by bombarding the entire structure with suitable conversion causing (e.g. oxygen or nitrogen) ions.

13 Claims, 1 Drawing Sheet

METHOD FOR FORMING PLANARIZED INTERCONNECT LEVEL USING SELECTIVE DEPOSITION AND ION IMPLANTATION

This is a division of application Ser. No. 778,691 filed Sept. 23, 1985, now abandoned.

FIELD OF THE INVENTION

The present invention relates in general to integrated circuits and is particularly directed to a methodology for forming a planarized metal/insulation interconnection arrangement by employing selective metal deposition and ion implantation.

BACKGROUND OF THE INVENTION

The continued growth and expansion of microminiaturized circuit architectures has involved an increase in complexity and packaging density of both the functional circuit elements contained within a semiconductor substrate and interconnection arrangements (metal/insulation structures) that overlie the surface of the substrate and which serve to interconnect components in the substrate to each other and to external electrical coupling terminals. Typically, the interconnection layers comprise multiple layers of signal coupling tracks that pass over and/or are interconnected to each other and/or to components in the underlying substrate, effectively creating a three-dimensional tiered or layered arrangements of conductors separated by insulator layers.

Because of the complexity of the integrated circuit layout in the semiconductor material of the chip and the resulting often tortuous interconnection pattern required, the potential for discontinuities in the interconnection pattern is a significant problem that must be minimized for achieving sought after yield and performance. In essence, what is desired is that each level of interconnect be effectively planar, namely without "steps", whereat corners and field gradients in a conductor layer give rise to contact/conductor separation (open circuits), punch through, etc.

One approach for achieving a planarized interconnect structure involves the use of a planarization overlay that is deposited over an uneven metal/insulator structure. The overlay is made of a material which, for a prescribed etchant, is etched at approximately the same rate as the highest (thickest) of the layers to be planarized. In its deposited configuration, the planarization overlay has a substantially flat upper surface. As a result, as the etchant attacks the overlay and the higher (thicker) material, the surface of the overall structure follows the flattened surface contour of the overlay, to thereby obtain a "planarized" structure. A drawback to this procedure is the fact that the overlay layer adds additional material to the structure, which is not functionally necessary for its operation, and requires additional processing steps.

SUMMARY OF THE INVENTION

In accordance with the present invention there is provided a new and improved methodology for forming a planarized interconnect structure that does not require the use of additional layer structure (e.g. the flattening layer discussed above) and thereby provides a more efficient processing scheme, while, at the same time, providing the sought-after packaging density and interconnect isolation for achieving operational performance of the overall architecture.

Pursuant to the present invention, on the surface of a semiconductor structure, such as a substrate containing functional elements to be selectively connected to an interconnection pattern or on the surface of a multi-level structure including substrate and one or more levels of interconnect thereover, a thin conductive, uniform (constant thickness) base layer, which promotes the growth of an interconnect conductor, is deposited. For a single level structure, such a base layer may comprise doped polycrystalline silicon which overlies contact areas of a silicon substrate, functional circuit element regions in which are to be conductively connected to the interconnect structure. To define the interconnect structure, a thick layer of insulation material (e.g. silicon nitride, silicon oxide, etc.) is formed on the surface of the base layer with openings in the insulation layer subsequently formed exposing portions of the base layer that are to be connected to the interconnect layer and thereby join the interconnect layer to underlying circuit element regions.

Next, on the portions of the base layer that are exposed by the openings in the insulation layer, a layer of interconnect metal, such as tungsten or gold, that effectively blocks the implantation of ions through it, is selectively deposited to fill the openings in the insulation layer and be even with the top surface of the insulation layer, whereby the insulation layer and deposited metal are effectively planarized.

The base layer which underlies the planarized insulator/interconnect metal layer is selectively converted to an insulator at those regions thereof beneath the insulator, but not beneath the interconnect metal, by bombarding the entire structure with suitable insulation conversion-causing (e.g. oxygen or nitrogen) ions. Because of its ion implantation masking properties relative to those of the insulator, the interconnect metal effectively blocks the insulation conversion-causing ions and prevents the ions from reaching the underlying base layer. In those regions of the base layer not covered by the interconnect metal, however, the base layer is converted to an insulator, so that that portion of the structure underlying the ion implanted base layer is effectively insulated from the interconnect metal by a planar insulator layer formed of a dual layer structure of a thin ion-converted base layer and the overlying thick insulator (oxide) layer.

DETAILED DESCRIPTION

Figure 1:
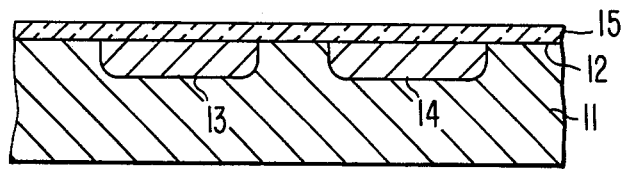
FIGS. 1–5 are diagrammatic illustrations of a cross-section of a portion of an integrated circuit interconnect structure at respective stages of its formation in accordance with the present invention.

Referring now to FIGS. 1–5 there are shown diagrammatic cross-sectional illustrations of a portion of an integrated circuit architecture to which the planarization interconnect methodology of the present invention is applied. In the embodiment described, the underlying semiconductor structure upon which the planarized interconnect arrangement is formed is shown as a substrate containing one or more functional element regions. It should be understood however, that the invention is applicable to any level of semiconductor architecture, including multi-level configurations. Moreover, while the present description relates to the formation of a single planarized level, it is to be appreciated that the interconnect planarization methodology of the invention is applicable to multiple levels of a semiconductor structure. FIG. 1 shows a planar silicon substrate 11 having a substantially planar surface 12 in which are formed respective active element regions 13 and 14. The details of the substrate and the functional circuit element regions disposed therein are not necessary for an understanding of the present invention and, accordingly, will not be detailed here. Rather, the description to follow will focus upon the interconnect scheme through which various regions in the substrate are interconnected to one another and to external connector terminals by the medium of the selectively formed and planarized interconnect structure.

In accordance with the present invention, an initial thin conductive base layer, such as aluminum or doped polysilicon, is formed on the surface 12 of the substrate 11. This thin layer is shown in FIG. 1 as a polysilicon layer 15 doped with an impurity such as arsenic, phosphorus or boron and having an impurity concentration on the order of $10^{19}$–$10^{20}$ cm$^{-3}$ and a thickness on the order of 500 Å. Where aluminum is used as the base layer, its thickness may be on the order of 5000 Å. What is important is that the properties of the base layer are such that they promote the growth of a metallization layer to be selectively formed, as will be described below.

Figure 2:
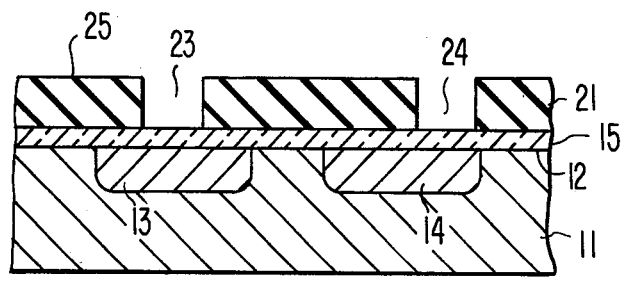

Next, as shown in FIG. 2, a relatively thick (on the order of 5000 Å) insulation layer 21, such as silicon oxide, is formed atop the doped polysilicon base layer 15. The thickness of the insulator layer 21 is chosen in accordance with the desired thickness of the ultimate interconnected pattern as well as the implant dosage of ions to be introduced into the base layer 15. For purposes of the present example, wherein doped polysilicon having a thickness on the order of 500 Å is formed as the base layer, insulator layer 21 may comprise a layer of silicon oxide or silicon nitride having a thickness in the range given above. A metallization mask photoresist layer is formed atop the insulator layer 21 and openings 23 and 24 are then etched in the insulator layer to expose portions of the doped polysilicon layer therebeneath.

Figure 3:
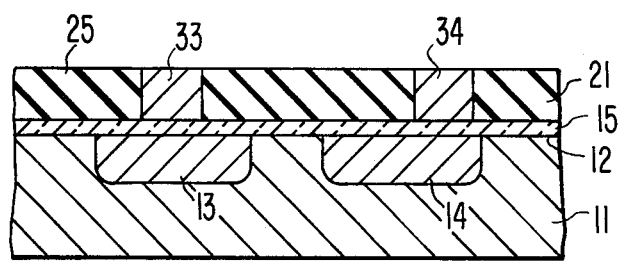

Next, as shown in FIG. 3, an interconnect metallization layer, such as tungsten or gold, is formed in the openings 23 and 24 of the insulator layer 21. Where tungsten is formed, it may be formed by the selective deposition of tungsten such as by the reduction of tungsten hexafluoride (WF$_6$) in a reduced pressure atmosphere. Where gold is formed in the openings 23 and 24, it may be formed by a standard gold electroplate or electroless process. In either event, the metallization layer is formed until it reaches the top surface 25 of the dielectric insulator layer 21. This effectively results in an overall planarized interconnect metal/insulator layer formed atop the doped polysilicon layer 15, as shown in FIG. 3. At this point in the process, each of the interconnect metallization layers 33 and 34 are effectively connected to each other and to all of the regions in the substrate beneath the polysilicon layer by virtue of their common conductive path through the doped polysilicon base layer 15.

In accordance with the present invention, selected portions of the underlying polysilicon layer are converted into insulator material by implanting ions, such as oxygen or nitrogen ions, through the metallization/insulator structure lying atop of the doped polysilicon, whereby those portions of the polysilicon base layer 15 beneath the insulator 21 are converted into silicon dioxide or silicon nitride, and thereby form an effectively continuous insulator layer extending from the upper top surface 12 of the semiconductor substrate 11 to the top surface 25 of the insualtor layer 21. (For a detailed description of the implantation of oxygen, nitrogen ions into semiconductive material to convert the material to an insulator, attention may be directed to the following U.S. patent literation: U.S. Pat. Nos. 3,622,382 and 3,666,548 to Brack et al; U.S. Pat. No. 3,897,274 to Stehlin et al; U.S. Pat. No. 4,084,986 to Aoki et al; U.S. Pat. No. 4,105,805 to Glendinning et al; U.S. Pat. No. 4,406,051 to Iizuka; and U.S. Pat. No. 4,479,297 To Mizutani et al.)

Figure 4:
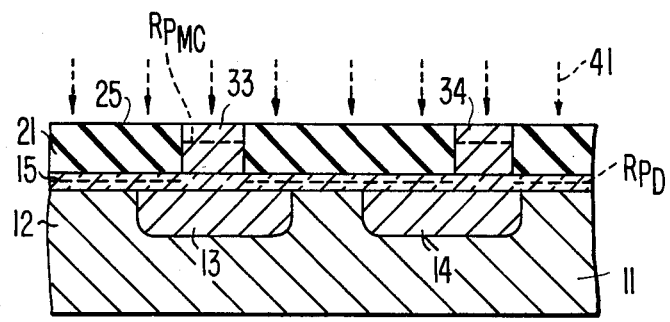
Figure 5:
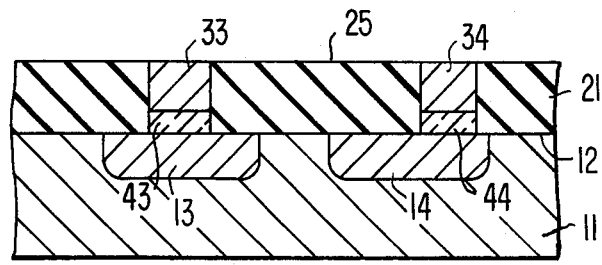

The ion implantation insulation conversion is effectively shown in FIGS. 4 and 5 wherein an ion implant beam 41 is directed through the dual metallization/insulator structure lying atop the doped polysilicon layer 15. Because of the differential ion implantation blockage characteristics of the metallization layer 33, 34 and the dielectric layer 21, the peak depth of the ion implanation doping profile effectively lies in the middle of the doped polysilicon base layer 15 in those portions of layers 15 beneath the dielectric layer 21, as shown by the broken lines $R_{PD}$ in FIG. 4, and also occurs at a very shallow level $R_{PM}$ in the metallization layers 33 and 34. In effect, the metallization layers 33 and 34 block the oxygen, nitrogen ions and prevent them from entering the polysilicon base layer directly beneath the metallization layers 33 and 34. On the other hand, because the dielectric layer 21 does not effectively impede the introduction of the nitrogen, oxygen ions into the polysilicon layer 15 therebeneath, the doped polysilicon becomes effectively amorphous. Next, the structure is exposed to a low temperature reaction bake or heat treatment, so that those portions of the doped polysilicon base layer that had been rendered amorphous by the introduction of the ion implanted nitrogen, oxygen ions become $SiO_{x(x\leq 2)}$, where oxygen is doped, and become $Si_3N_{y(y\leq 4)}$ where nitrogen is doped.

For the materials and range of thicknesses of the metallization layer, polysilicon layer, and dielectric layer thereon described above, nitrogen and/or oxygen ions may be implanted at an energy on the order of 360 KeV with a dose on the order of $10^{18}$ ions/cm$^2$. Where aluminum is employed as the base layer 15, having a thickness on the order of 500 Å, to provide $R_{PM}$ at a distance of 3700 Å from the top surface of the aluminum, the implant energy of the nitrogen/oxygen ions must be on the order of 360 KeV.

As will be appreciated from the foregoing description of the methodology of the present invention, by taking advantage of the fact that oxygen/nitrogen ions can be employed to convert a layer of conductive material (e.g. doped polysilicon, aluminum) into an insulator, and using the differential implantation inhibiting properties of an interconnect metal such as tungsten or gold as compared with that of a dielectric layer, a very simplified planarization technique for forming a planarized metal/insulator interconnect layer can be achieved.

While I have shown and described an embodiment in accordance with the present invention, it is understood that the same is not limited thereto but is susceptible of numerous changes and modifications as known to a person skilled in the art, and I therefore do not wish to be limited to the details shown and described herein but intend to cover all such changes and modifications as are obvious to one of ordinary skill in the art.

We claim:

1. A method of forming an interconnect pattern on the surface of a semiconductor structure having prescribed portions thereof to be conductively connected with said interconnect pattern comprising the steps of:
   (a) forming a first conductive layer on said surface of said semiconductor structure;
   (b) selectively forming a first insulator layer on said first conductive layer so as to expose surface areas of said first conductive layer whereat conductive contact with said interconnect pattern is desired;
   (c) forming a second conductive layer on the surface areas of said first conductive layer exposed in step (b); and
   (d) converting regions of said first conductive layer not exposed by step (b) into insulator material by implanting ions into said first conductive layer using saud second conductive layer as a mask.

2. A method according to claim 1, wherein said second conductive layer is formed so as to be effectively coplanar with the top surface of said first insulator layer.

3. A method according to claim 2, wherein said second conductive layer comprises a metal selected from the group consisting of tungsten and gold.

4. A method according to claim 1, wherein step (d) further includes the step of heating said first conductive layer in said region in which ions have been implanted to form a second insulator layer contiguous with said first insulator layer thereon.

5. A method according to claim 1, wherein said first conductive layer comprises a layer of aluminum.

6. A method according to claim 1, wherein said first conductive layer comprises a layer of polycrystalline semiconductor material doped with an impurity of a prescribed conductivity type.

7. A method according to claim 1, wherein said ions include ions selected from the group consisting of oxygen and nitrogen.

8. A method according to claim 7, wherein said first conductive layer comprises a layer of polycrystalline silicon.

9. A method of forming a planarized interconnect pattern on the surface of a semiconductor integrated circuit structure having portions thereof to be conductively connected with said interconnect pattern comprising the steps of:
   (a) forming a first conductive layer of uniform thickness on the surface of said semiconductor integrated circuit structure;
   (b) selectively forming a first insulator layer on said first conductive layer so as to expose surface areas of said first conductive layer whereat conductive contact between said portions of said structure and said interconnect pattern is desired;
   (c) forming a second conductive layer on the surface areas of said first conductive layer exposed in step (b) so as to be effectively coplanar with the top surface of said first insulator layer; and
   (d) converting regions of said first conductive area other than those on which said second conductive layer was formed in step (c) into the insulator material by implanting ions into said first conductive layer using said second conductive layer as a mask.

10. A method according to claim 9, wherein step (d) further includes the step of heating said first conductive layer in said regions in which ions have been implanted to form a second insulator layer contiguous with said first insulator layer thereon.

11. A method according to claim 10, wherein said second conductive layer comprises a metal selected from the group consisting of tungsten and gold.

12. A method according to claim 11, wherein said first conductive layer comprises a layer of aluminum.

13. A method according to claim 13, wherein said first conductive layer comprises a layer of polycrystalline silicon.

* * * * *